(12) United States Patent
Kawakubo et al.

(10) Patent No.: US 8,038,890 B2
(45) Date of Patent: Oct. 18, 2011

(54) PIEZOELECTRIC-DRIVEN MEMS DEVICE AND METHOD FOR MANUFACTURING THE SAME

(75) Inventors: Takashi Kawakubo, Kanagawa-Ken (JP); Toshihiko Nagano, Kanagawa-Ken (JP); Kazuhide Abe, Kanagawa-Ken (JP); Michihiko Nishigaki, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 768 days.

(21) Appl. No.: 12/038,568

(22) Filed: Feb. 27, 2008

(65) Prior Publication Data

US 2008/0164237 A1 Jul. 10, 2008

Related U.S. Application Data

(62) Division of application No. 11/115,107, filed on Apr. 27, 2001, now Pat. No. 7,459,827.

(30) Foreign Application Priority Data

Apr. 28, 2004 (JP) ................. 2004-133736

(51) Int. Cl.
*G01D 15/00* (2006.01)
*G11B 5/127* (2006.01)
*H01L 21/00* (2006.01)
*H01L 21/302* (2006.01)
*H01L 21/461* (2006.01)

(52) U.S. Cl. .............. 216/17; 438/42; 438/692

(58) Field of Classification Search .............. None
See application file for complete search history.

(56) References Cited

U.S. PATENT DOCUMENTS

| 5,818,148 A | 10/1998 | Shiomi |
| 6,759,787 B2 | 7/2004 | Miller et al. |
| 6,949,866 B2 | 9/2005 | Miller et al. |
| 7,119,494 B2 | 10/2006 | Hui et al. |
| 2001/0029058 A1* | 10/2001 | Jech et al. .............. 438/48 |
| 2005/0162040 A1 | 7/2005 | Robert |

FOREIGN PATENT DOCUMENTS

| JP | 10-290036 | 10/1998 |
| JP | 2000-31397 | 1/2000 |
| JP | 2002-100276 | 4/2002 |
| JP | 2003-178663 | 6/2003 |
| JP | 2003-245898 | 9/2003 |
| WO | WO 03/069776 | 8/2003 |
| WO | WO 03/069776 A2 | 8/2003 |

* cited by examiner

*Primary Examiner* — Nadine G Norton
*Assistant Examiner* — Stephanie Duclair
(74) *Attorney, Agent, or Firm* — Oblon, Spivak, McClelland, Maier & Neustadt, L.L.P.

(57) ABSTRACT

A piezoelectric-driven MEMS device can be fabricated reliably and consistently. The piezoelectric-driven MEMS device includes: a movable flat beam having a piezoelectric film disposed above a substrate with a recessed portion such that the piezoelectric film is bridged over the recessed portion, piezoelectric drive mechanisms disposed at both ends of the piezoelectric film and configured to drive the piezoelectric film, and a first electrode disposed at the center of the substrate-side of the piezoelectric film, and a second electrode disposed on a flat part of the recessed portion of the substrate and facing the first electrode of the movable flat beam.

2 Claims, 13 Drawing Sheets

SECTION A-A

SECTION B-B

SECTION A-A

SECTION B-B

SECTION B-B

PIEZOELECTRIC-DRIVEN MEMS DEVICE AND METHOD FOR MANUFACTURING THE SAME

CROSS-REFERENCE TO RELATED APPLICATION

This application is a divisional of U.S. application Ser. No. 11/115,107 filed Apr. 27, 2001 which issued as U.S. Pat. No. 7,459,827, and is based upon and claims benefit of priority from prior Japanese Patent Application No. 2004-133736 filed on Apr. 28, 2004 in Japan, the entire contents of each of which are incorporated herein by reference.

BACKGROUND OF THE INVENTION

1. Field of the Invention

The present invention relates to a piezoelectric-driven micro-electro-mechanical system (MEMS) device having piezoelectric drive mechanisms using a piezoelectric thin film and a method for manufacturing the same.

2. Related Art

Conventionally, a variable capacitor diode utilizing a change in thickness of the depletion layer of a PN junction have been used as a variable capacitor. The variable capacitor diode, however, has limited applications due to a capacitance change of only on the order of at most 5 times, and a small Q factor of on the order of 20-30 where a higher Q factor indicates less loss.

On the other hand, a variable capacitor fabricated using MEMS technology has recently attracted attention. A microswitch or a variable capacitor according to conventional MEMS technology utilizes an electrostatic force as a driving force. A MEMS device utilizing an electrostatic force has an advantage of a simple operating mechanism in which it can be operated only by applying a driving voltage to a pair of spaced electrodes (for example, see "Smart Structure and Materials 2002: Smart Electronics, MEMS and Nanotechnology", V. K. Varadan, Editor, Proceedings of SPIE Vol. 4700 (2002), pp. 40-49).

On the contrary, the electrostatic force being essentially inversely proportional to the square of the distance results in a phenomenon called pull-in in which the space is discontinuously closed within the two-third of the initial space where the relationship between the applied voltage and the travel of electrons is nonlinear. The operating range is therefore narrow and generally a driving voltage of 20 volts or greater is required to move the electrodes a distance of 1 μm or greater. Under the present situation, the problem of high driving voltage hinders the applications in general consumer products.

Consequently, a variable capacitor can be conceived which has a movable electrode of the variable capacitor on a beam supported in the air above a substrate and provided with a piezoelectric thin film, and a fixed electrode of the variable capacitor on the confronting substrate, and in which the beam is driven with a piezoelectric force to change the distance between the movable and fixed electrodes.

Conventional methods for fabricating a beam structure supported in the air using MEMS technology include a method that involves fabricating a beam structure on a Si layer of an SOI substrate and removing part of the Si layer to thereby support the beam structure in the air, and a method that involves fabricating a beam structure on a Si substrate and forming a trench penetrating through the surface of the substrate by wet etching or RIE from the back side of the substrate to thereby support the beam structure in the air. Although these methods can create a movable beam and a movable electrode, it is difficult to form a fixed opposing electrode on the underlying substrate.

Alternatively, a fixed electrode is first formed on a substrate; then a sacrificial layer is formed thereon; a movable beam and a movable electrode are then formed so that they are bridged over the sacrificial layer; and then the sacrificial layer is removed, so that a beam structure supported in the air is fabricated. In this manner, a cantilever beam or fixed beam bridge structure having bend portions on the substrate is fabricated.

In the case of a cantilever beam structure, there is a problem that a slight residual stress in the material forming the beam causes the beam to warp upward or downward, and it is thereby significantly difficult to fabricate the structure with a constant distance between the movable and fixed electrodes, resulting in inconsistent manufacturing.

In the case of a fixed beam bridge structure, the fabrication can be performed somewhat more consistent than in a cantilever beam structure. Again however, there is a problem that a compression residual stress in the film material forming the beam causes the beam to warp upward or a tensile residual stress conversely causes the beam to warp downward, and it is thereby also significantly difficult to fabricate the structure with a constant distance between the movable and fixed electrodes, resulting in inconsistent manufacturing.

Also, both the cantilever and fixed beam structures have a common reliability problem, as described later, such that drive electrodes forming the piezoelectric drive mechanism are cut and shifted or the beam is cracked at the bent structures formed on the corners of the sacrificial layer.

SUMMARY OF THE INVENTION

The present invention has been made in view of these circumstances. It is an object of the present invention to provide a piezoelectric-driven MEMS device which can be fabricated reliably and consistently.

A piezoelectric-driven MEMS device according to a first aspect of the present invention includes: a movable flat beam having a piezoelectric film disposed above a substrate with a recessed portion such that the piezoelectric film is bridged over the recessed portion, piezoelectric drive mechanisms disposed on both ends of the piezoelectric film and configured to drive the piezoelectric film, and a first electrode disposed at the center of the substrate-side of the piezoelectric film; and a second electrode disposed on a flat part of the recessed portion of the substrate and facing the first electrode of the movable flat beam.

A piezoelectric-driven MEMS device according a second aspect of the present invention includes: a movable flat beam having two end of which one end is supported on a substrate with a recessed portion and the other end is free, and including a flat piezoelectric film disposed above the recessed portion, piezoelectric drive mechanisms disposed on one end of the piezoelectric film and configured to drive the piezoelectric film, and a first electrode disposed on the substrate-side of the piezoelectric film; and a second electrode disposed on a flat part of the recessed portion of the substrate and facing the first electrode of the movable flat beam.

A mobile communication apparatus according to a third aspect of the present invention includes: a voltage controlled oscillator having a piezoelectric-driven MEMS device according to claim 1 as a variable capacitor.

A mobile communication apparatus according to a fourth aspect of the present invention includes: a tunable matching circuit having a piezoelectric-driven MEMS device according to claim 1 as a variable capacitor.

A mobile communication apparatus according to a fifth aspect of the present invention includes: a piezoelectric-driven MEMS device according to claim 1 as a high frequency-switch.

A method for manufacturing a piezoelectric-driven MEMS device according to a sixth aspect of the present invention includes: forming a recessed portion with a flat bottom on a substrate; forming a first electrode on the bottom of the recessed portion; filling the recessed portion with a sacrificial layer; removing the sacrificial layer on the surface of the substrate and flattening the surface of the substrate; forming a movable beam above the substrate such that the movable beam is bridged over the recessed portion, the movable beam having at least a piezoelectric film, piezoelectric drive mechanisms for driving the piezoelectric film, and a second electrode facing the first electrode; and etching off the sacrificial layer.

DETAILED DESCRIPTION OF THE INVENTION

Firstly, before the description of embodiments of the present invention, there will be explained how the inventors have conceived the present invention. The inventors used a sacrificial layer process, which has been conventionally used for an electrostatic actuator and the like, to experimentally make a shunt MEMS switch utilizing a unimorph piezoelectric-driven actuator for investigation.

Figure 13:
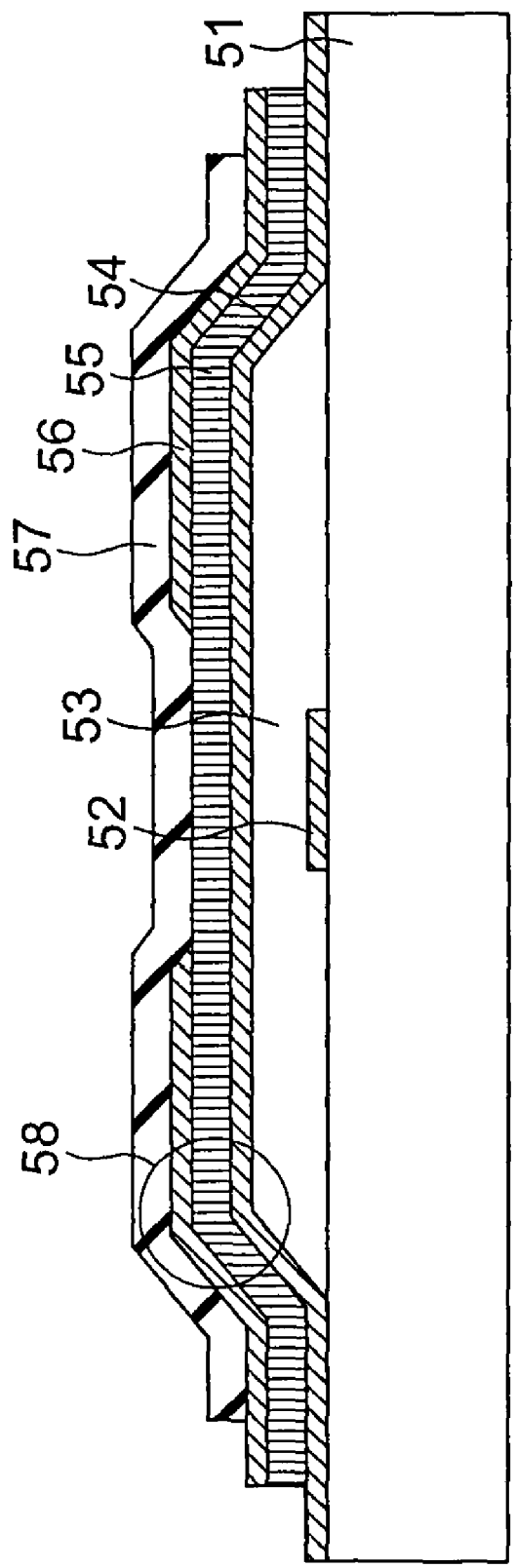
FIG. 13 is a cross-sectional view illustrating the configuration of a variable capacitor with a bent-structured piezoelectric film.

FIG. 13 shows a cross-sectional structure of the experimentally-made MEMS switch. The MEMS switch comprises a fixed electrode 52 formed on an insulated substrate 51, a cavity 53 fabricated by selectively etching off a sacrificial layer (not shown), an electrode 54 serving as both a lower electrode of a piezoelectric actuator and a movable electrode of the switch, a piezoelectric film 55, an upper electrode 56 of the piezoelectric actuator, and a support layer 57.

Examples of materials for the piezoelectric film 55 conceivably include lead zirconate titanate (PZT), barium titanate (BTO), both of which are perovskite ferroelectrics, aluminum nitride (AlN), zinc oxide (ZnO), both of which are wurtzite piezoelectrics, etc. Although perovskite ferroelectric materials have a very strong piezoelectric property, their poor shape stability due to their crystal structures makes it very difficult to fabricate a thin, elongate bridge structure like a piezoelectric actuator. Consequently, a piezoelectric film of c-axis oriented AlN which has a wurtzite crystal structure was used as the piezoelectric film of the experiment. The AlN used had to have its c-axis oriented perpendicular to the film thickness direction because AlN exhibits piezoelectric property only in the c-axis direction.

The MEMS switch having a bridge structure shown in FIG. 13 was fabricated in a known process and a switching operation was performed by applying a DC voltage between the lower electrode 54 and the upper electrode 56. After several switching operations, the switch was unable to operate because the bridge structure broke at the bend portion 58.

Figure 14:
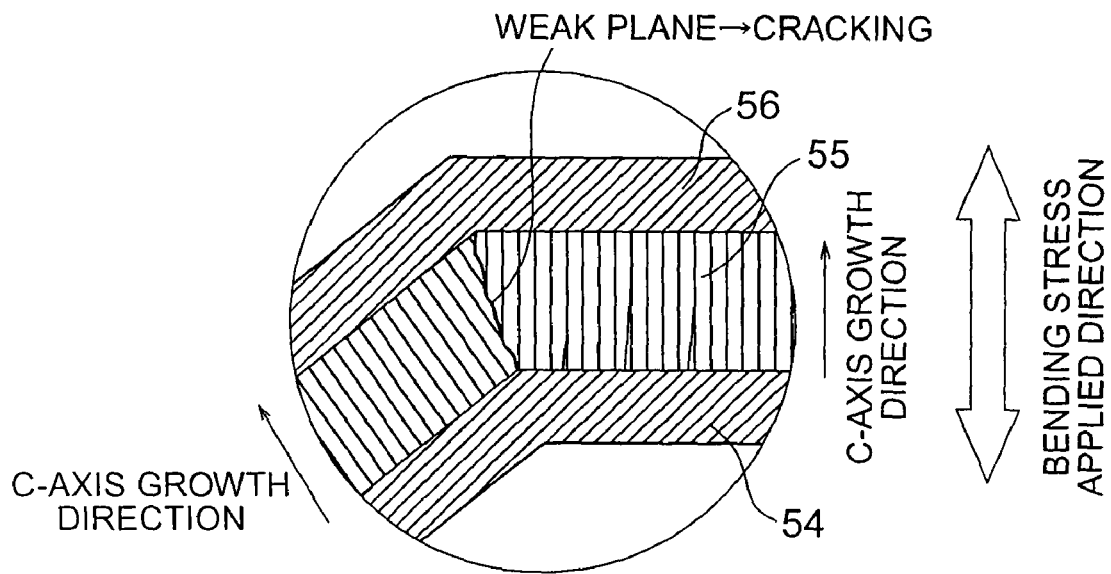
FIG. 14 is a view illustrating a problem of the variable capacitor shown in FIG. 13.

The cross-sectional structure of the piezoelectric actuator portion was examined in detail and the result was shown in FIG. 14. It was found from the results of the examination that such a breaking mode is a problem unique to a bridge-structured piezoelectric actuator fabricated using the c-axis oriented piezoelectric film 55 with a hexagonal crystal structure and provided with the bend portion 58 when operated in a repeated bending cycle.

Figure 15:
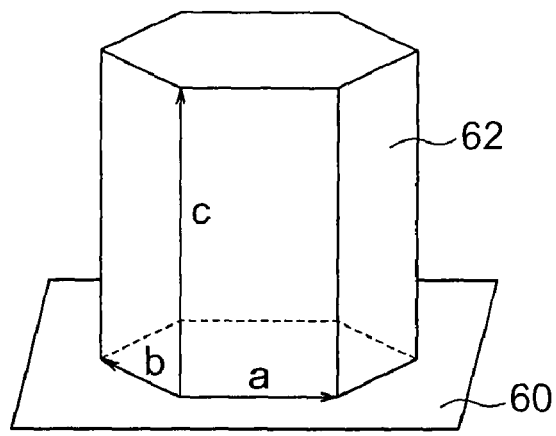
FIG. 15 is a view illustrating orientation characteristics of a hexagonal crystal structure.

That is, as diagrammatically shown in FIG. 15, a hexagonal crystal 62 such as wurtzite, has the property of being oriented along the c-axis with respect to the substrate 60, and the growth rate in the c-axis direction is much higher than that in the a-axis and b-axis directions, both of which are perpendicular to the c-axis. If a bridge structure having a bend portion is fabricated using a piezoelectric film made of such a hexagonal crystal material, it was proved that the crystal grains of AlN form a very strong columnar crystal with respect to the plane of the lower electrode 54 and the difference in columnar crystal orientation at the bend portion 58 creates a sparse, very weak plane in the piezoelectric film 55, as shown in FIG. 14. It was found that if this weak plane is subjected to a bending stress caused by the switching operation, a crack is readily initiated and propagated to the electrodes 54, 56 by a few switching operations, resulting in breaking of the piezoelectric film.

Thus, it was first found by the inventors that a piezoelectric-driven MEMS actuator having a piezoelectric actuator structure which uses a piezoelectric film of c-axis oriented wurtzite crystal such as AlN or ZnO and has a bent bridge portion breaks if a bending stress caused by piezoelectric driving is repeatedly applied to the actuator, which therefore does not work properly as a piezoelectric actuator.

A piezoelectric-driven MEMS device according to the present invention has a break-resistant structure against a repeatedly applied bending stress.

Embodiments of the present invention will be described below with reference to the drawings.

First Embodiment

Figure 1:
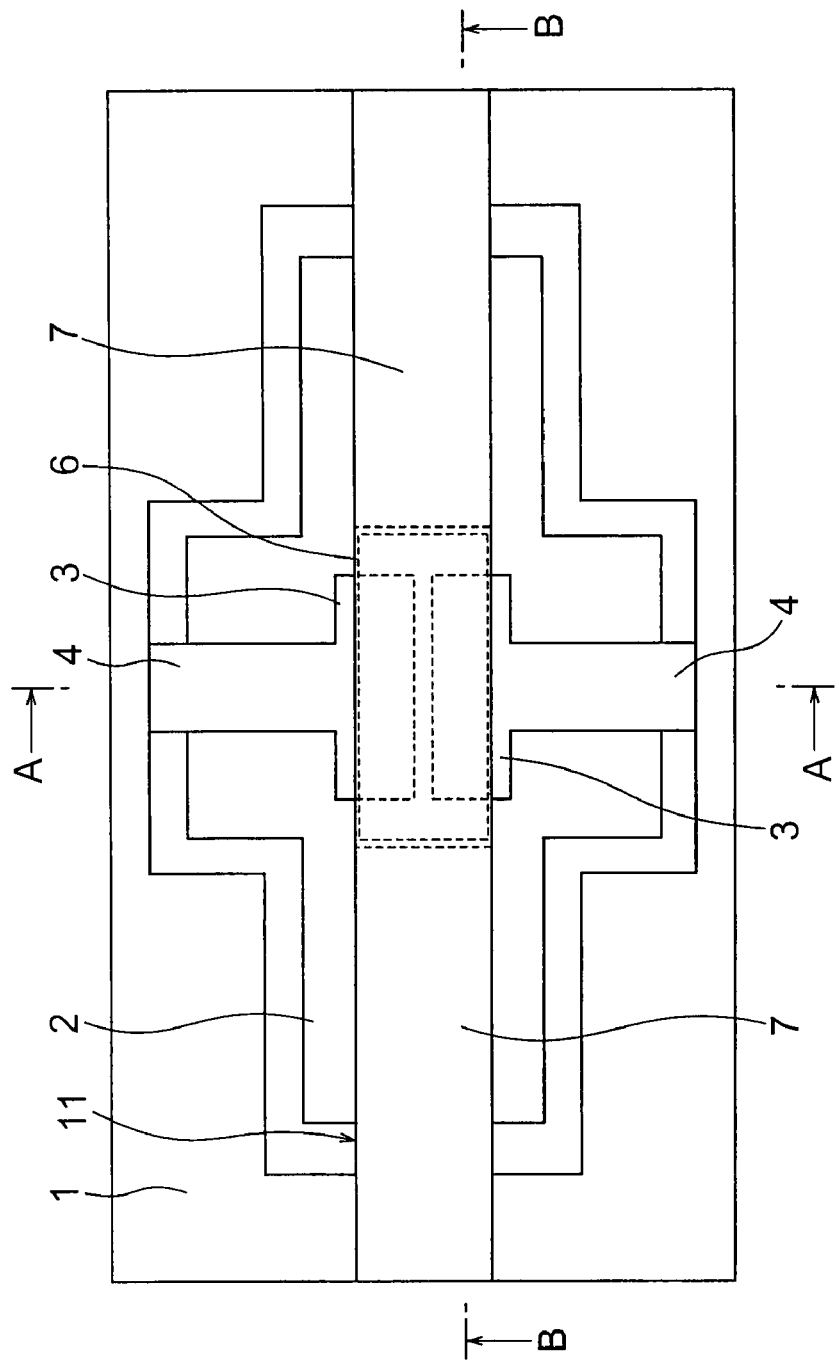
FIG. 1 is a plan view illustrating the configuration of a piezoelectric-driven MEMS device according to a first embodiment of the present invention.
Figure 2:
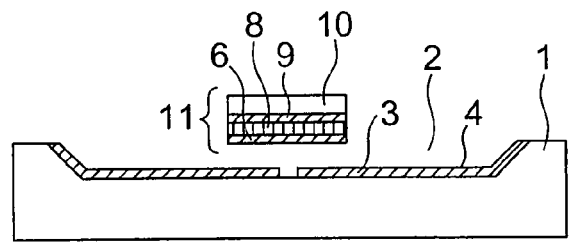
FIG. 2 is a cross-sectional view of the piezoelectric-driven MEMS device according to the first embodiment taken along the section line A-A shown in FIG. 1.
Figure 3:
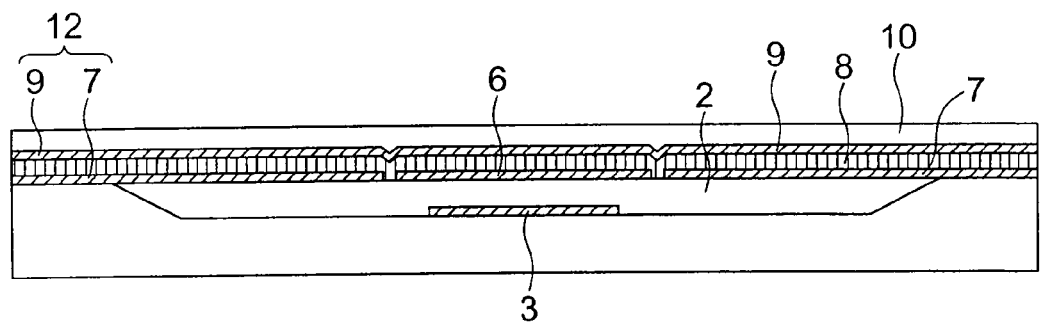
FIG. 3 is a cross-sectional view of the piezoelectric-driven MEMS device according to the first embodiment taken along the section line B-B shown in FIG. 1.

FIGS. 1 to 3 show a piezoelectric-driven MEMS device according to a first embodiment of the present invention. The piezoelectric-driven MEMS device according to this embodiment is a variable capacitor having a fixed beam structure. In this specification, a "fixed beam" is a beam of which both ends is fixed. FIG. 1 is a plan view of the piezoelectric-driven MEMS device according to the embodiment. FIG. 2 is a cross-sectional view taken along the section line A-A shown in FIG. 1. FIG. 3 is a cross-sectional view taken along the section line B-B shown in FIG. 1.

The piezoelectric-driven MEMS device according to the embodiment comprises fixed electrodes 3 disposed on a flat bottom of a recessed portion 2 formed in a substrate 1, extension electrodes 4 disposed on the recessed portion 2 and electrically connected to the fixed electrodes 3, and a movable beam 11 having a fixed beam structure disposed above the substrate 1 such that the beam is bridged over the recessed portion 2. The movable beam 11 comprises a flat piezoelectric film 8 disposed above the substrate 1 such that the film is bridged over the substrate 1 and having a narrower width than that of the recessed portion 2, an upper electrode 9 disposed on the piezoelectric film 8, a support film 10 disposed on the upper electrode 9 and supporting the piezoelectric film 8, a lower electrodes 7 disposed on both ends of the piezoelectric film 8 on the same side of the substrate 1, and a movable electrode 6 disposed at the center of the piezoelectric film 8 on the same side of the substrate 1 and facing the fixed electrodes 3. The lower electrodes 7 and the upper electrode 9 form piezoelectric drive mechanisms 12. In the embodiment, the fixed electrodes 3 are shown to be divided into two, they may be integrated into one. The recessed portion 2 has the shape of a cross as shown in FIG. 1.

In such a configuration of MEMS device, application of a voltage between the lower electrodes 7 and the upper electrode 9 results in deflection of the piezoelectric film 8, thereby changing the distance between the movable electrode 6 and the fixed electrodes 3 and hence changing the capacitance.

A method for manufacturing the MEMS device according to the embodiment will be described with reference to FIGS. 4A to 5C. FIGS. 4A to 5C are cross-sectional views for various process stages taken along the section line B-B shown in FIG. 1.

Figure 4A:
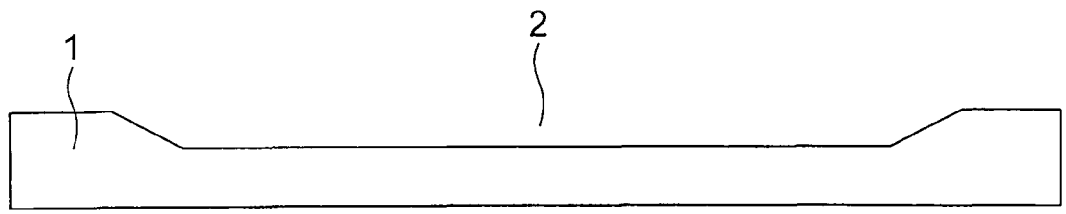
FIGS. 4A to 4D are cross-sectional views illustrating manufacturing processes of the piezoelectric-driven MEMS device according to the first embodiment of the present invention.

As shown in FIG. 4A, the shallow recessed portion 2 with tapered ends and a flat central part is formed by etching the substrate 1 having an insulative surface using lithography technology. The etching process may be wet etching, reactive ion etching (RIE), or the like. The recessed portion may be formed by forming an insulating film (not shown) on the substrate 1 and etching part of the insulating film.

Figure 4B:
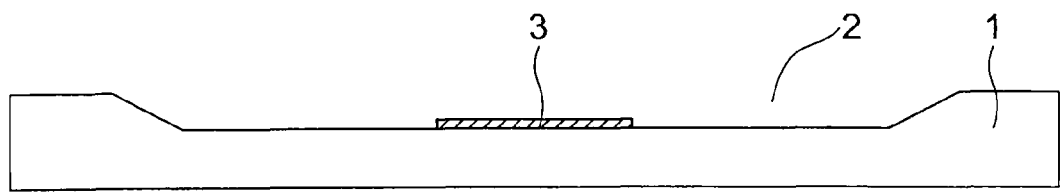

Next, as shown in FIG. 4B, the fixed electrodes 3 and their extension electrodes 4 of the variable capacitor (see FIG. 1) are formed on the bottom of the recessed portion 2. If the fixed electrodes 3 and extension electrodes 4 are made of metal such as Al, Ta, or Mo, those electrodes may be fabricated by forming a metal layer and etching the metal layer using lithography technology. If the electrodes are made of precious metal such as Au or Pt, the electrodes may be fabricated in a known lift-off process. In this embodiment, the fixed electrodes 3 and extension electrodes 4 were fabricated by forming a 200 nm-thick Au layer in a lift-off process.

Figure 4C:
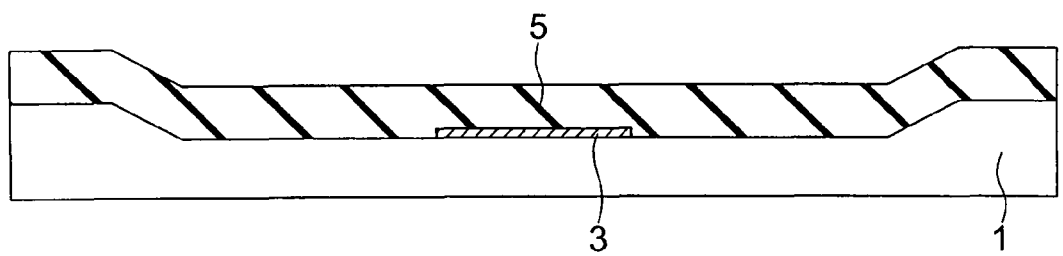
Figure 4D:
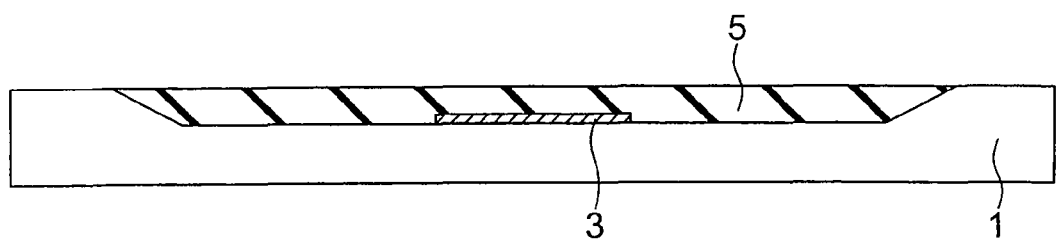

Next, as shown in FIG. 4C, a sacrificial layer 5 was formed such that it filled the recessed portion 2. Inorganic, metal, or organic material which can be etched selectively with respect to other film material can be used as a sacrificial layer. In this embodiment, phosphor-doped silicon oxide (PSG) was used. As shown in FIG. 4D, this process was followed by polishing and planarizing the surface of the sacrificial layer until the surface of the substrate 1 is exposed using known chemical mechanical polishing (CMP) technology.

Figure 5A:
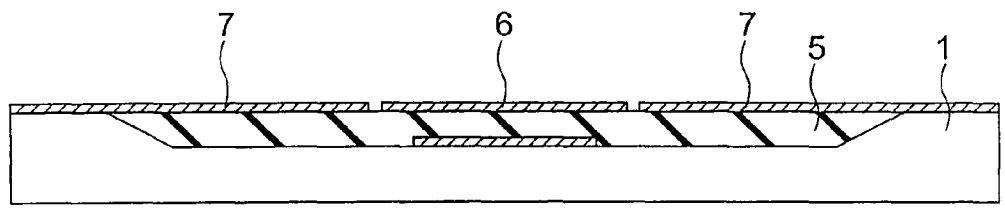
FIGS. 5A to 5C are cross-sectional views illustrating manufacturing processes of the piezoelectric-driven MEMS device according to the first embodiment of the present invention.

Next, as shown in FIG. 5A, the movable electrode 6 of the variable capacitor and the lower electrodes 7 of the piezoelectric drive mechanisms were simultaneously formed on the sacrificial layer 5. If the material of those electrodes is a metal such as Al, Ta, or Mo, those electrodes may be fabricated by forming a metal layer and etching the metal layer using lithography technology. If the material is a precious metal such as Au or Pt, the electrodes may be fabricated in a known lift-off process. In this embodiment, the movable electrode 6 and lower electrodes 7 were fabricated by forming a 200 nm-thick Au layer in a lift-off process.

Figure 5B:
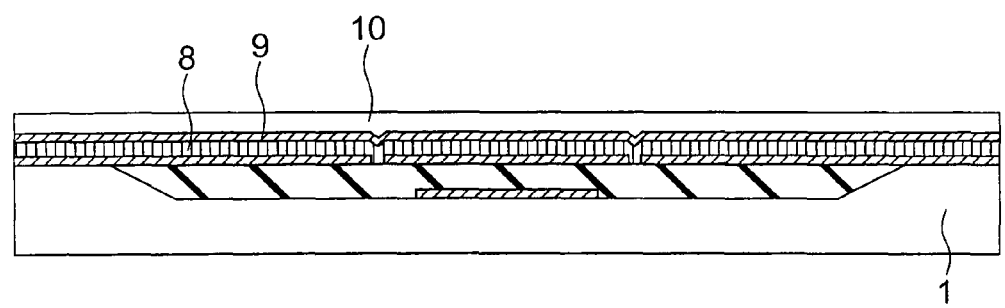

Next, as shown in FIG. 5B, the piezoelectric film 8, the upper electrode 9, and the support film 10 were sequentially formed. In this embodiment, a 500 nm-thick, c-axis oriented AlN film was used as the piezoelectric film 8, and a 200 nm-thick Au film was used as the upper electrode 9, and a 1 μm-thick polysilicon layer was used as the support film 10.

Figure 5C:
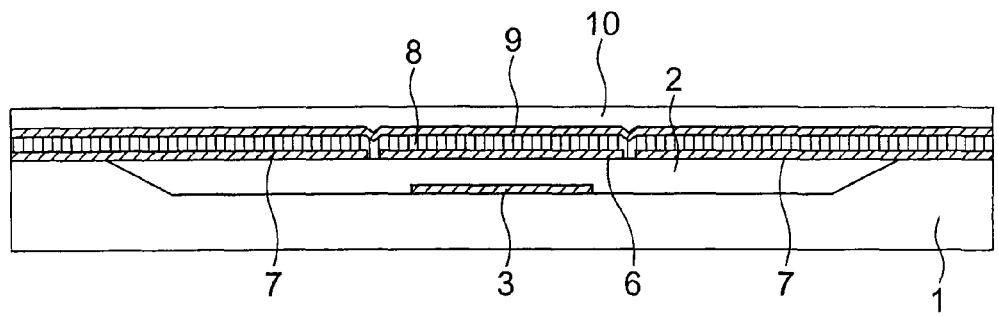

Next, as shown in FIG. 5C, the sacrificial layer 5 was selectively etched off with diluted hydrofluoric acid to fabricate the planar, movable beam 11 comprising the piezoelectric film 8, the piezoelectric drive mechanisms 12, and the movable electrode 6.

A control voltage (Vtune) of 0 V to 3 V was applied between the upper electrode 9 and lower electrodes 7 of the piezoelectric drive mechanisms 12, and extension electrodes 4 connected to the two fixed electrodes 3 of the variable capacitor were connected with pads by wire bonding in order to measure the capacitance of the capacitor. As a result, continuously variable capacitance was obtained ranging from a minimum of 0.22 pF to a maximum of 5.1 pF, which was a very wide variable range with a ratio of 25.

As described above, according to the embodiment, it is possible to maintain a flat shape of the variable capacitor by forming the flat movable beam 11 even if there is a small amount of residual compression stress or residual tensile stress not being high enough to cause breaking of the film which may be present in the film material forming the movable beam 11. It is therefore possible to maintain a constant distance between the movable electrode 6 formed on the movable beam 11 and the fixed electrodes 3 and hence control the initial capacitance at a constant value.

A movable beam structure having the piezoelectric drive mechanisms 12 may be a structure in which a piezoelectric film sandwiched between an upper electrode and a lower electrode is laminated to a support film, which is a so-called unsymmetrical bimorph structure, a structure in which two layers, each having a piezoelectric film sandwiched between an upper electrode and a lower electrode, are laminated each other, which is a so-called symmetrical bimorph structure, a structure in which a support layer, a laterally-polarized piezoelectric film thereon, and a comb electrode are laminated, which is called a unimorph structure, or the like. Since several bimorph or unimorph structures described above can be juxtaposed in the longitudinal direction of the beam with their polarities alternatively reversed in order to achieve a higher curvature, such a structure can also be used.

Preferably, the piezoelectric used for the piezoelectric film 8 is made of a material having a wurtzite crystal structure, such as aluminum nitride (AlN) or zinc oxide (ZnO), because of its stability. Lead-zirconate-titanate (PZT) or barium titanate (BTO), both of which are perovskite ferroelectrics, can also be used.

It is also desirable that the material of the upper and lower electrodes 7, 9 of the piezoelectric drive mechanisms 12, the movable electrode 6, and the fixed electrodes 3 is a low-resistivity metal, such as aluminum (Al), gold (Au), platinum (Pt), copper (Cu), iridium (Ir), tungsten (W), molybdenum (Mo) or the like because of its resistivity and manufacturability of a thin film.

As described above, the flat movable beam according to the embodiment is break-resistant against a repeatedly applied bending stress and provides high reliability. Also, by adjusting the voltage between the upper and lower electrodes of the piezoelectric drive mechanisms, it is possible to maintain a constant distance and hence the capacitance between the movable and fixed electrodes, and provide a reliable, variable capacitor having a consistently manufacturable structure. Furthermore, many advantages are provided such that a large variable distance between the movable and fixed electrodes provides a high capacitance change rate, and the use of air or gas as a dielectric provides a very high Q factor.

Although in the embodiment the MEMS device has been described as a variable capacitor, by way of example, the structure of the variable capacitor can also be used without modification as a switch by directly making a contact between the movable and fixed electrodes. It can also be used as a switch by directly making a contact between the movable and fixed electrodes with an ultra-thin dielectric film therebetween especially for use at high frequencies in the GHz range or higher. In this case, it is possible to keep the distance between the electrodes of the switch and its operating voltage constant and achieve a switch having a reliable, consistently manufacturable structure.

Second Embodiment

Figure 6:
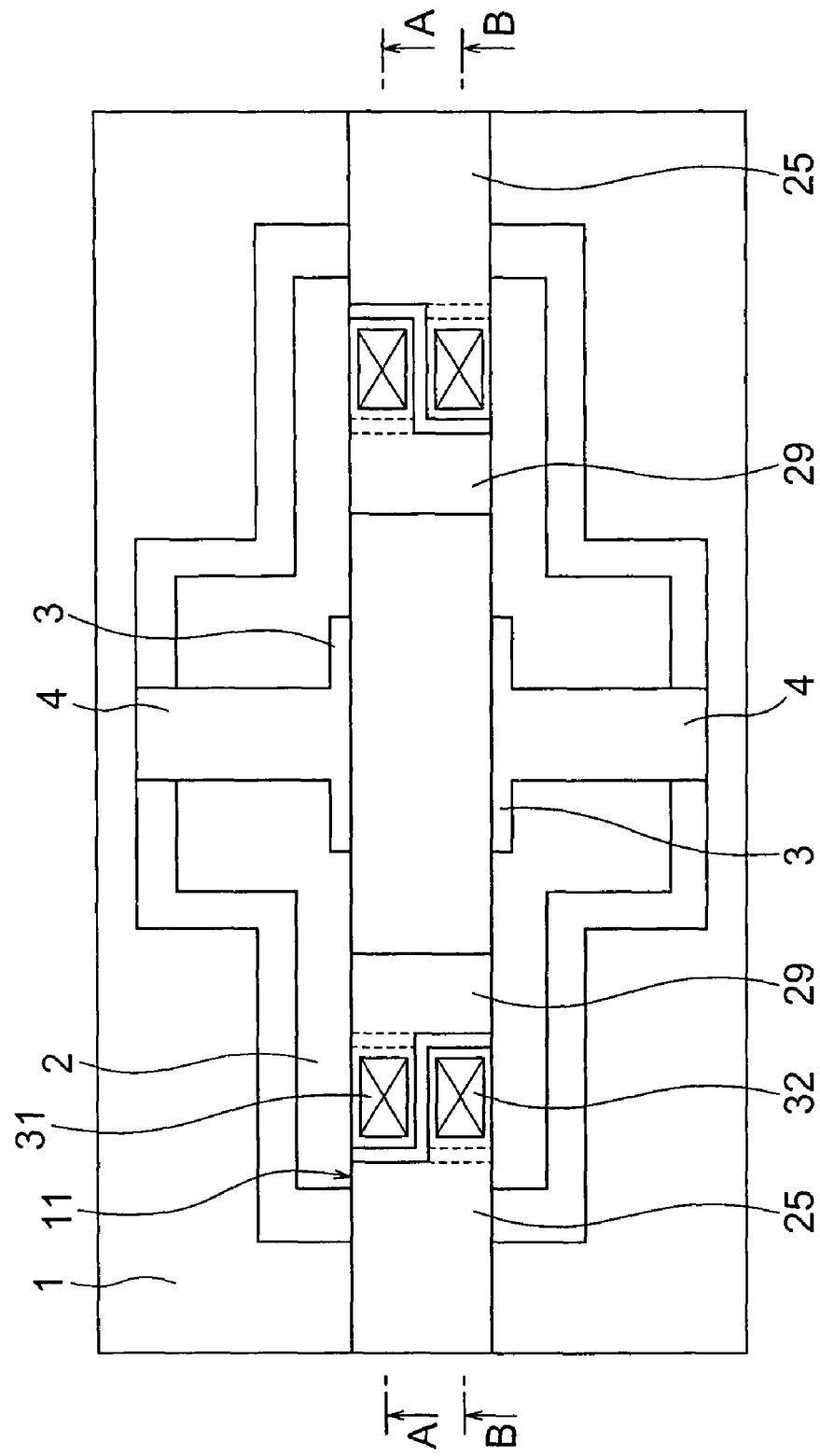
FIG. 6 is a plan view illustrating the configuration of a piezoelectric-driven MEMS device according to a second embodiment of the present invention.
Figure 7:
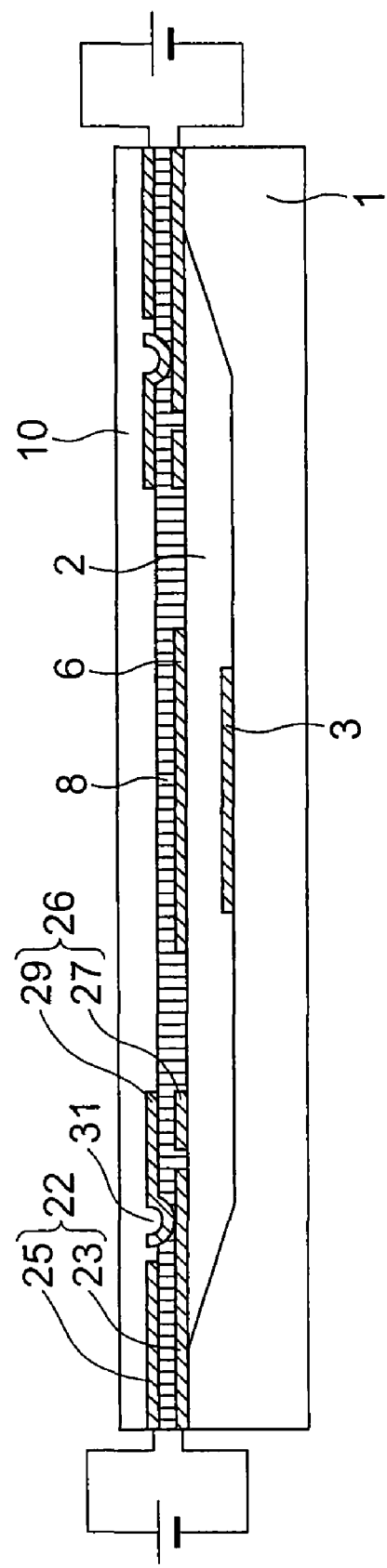
FIG. 7 is a cross-sectional view of the piezoelectric-driven MEMS device according to the second embodiment taken along the section line A-A shown in FIG. 6.
Figure 8:
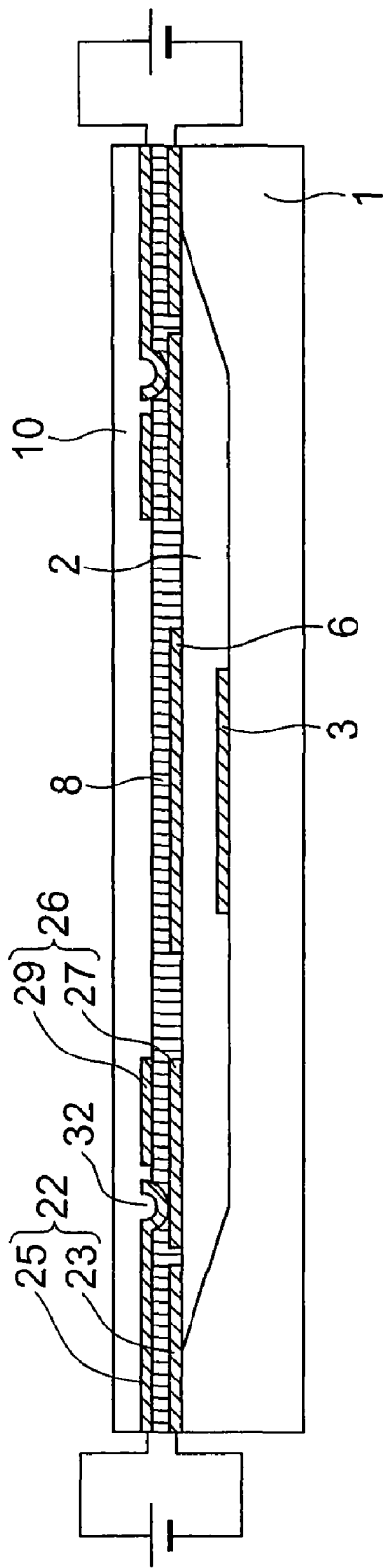
FIG. 8 is a cross-sectional view of the piezoelectric-driven MEMS device according to the second embodiment taken along the section line B-B shown in FIG. 6.

A piezoelectric-driven MEMS device according to a second embodiment of the present invention will be described with reference to FIGS. 6 to 8. The piezoelectric-driven MEMS device of this embodiment is a variable capacitor comprising a few (two in this embodiment) bimorph structures, in which a piezoelectric film sandwiched between a lower electrode and an upper electrode is laminated to a support layer, juxtaposed in the longitudinal direction of the beam with their polarities alternatively reversed, resulting in a higher curvature. FIG. 6 is a plan view of the piezoelectric-driven MEMS device according to the embodiment. FIG. 7 is a cross-sectional view taken along the section line A-A shown in FIG. 6. FIG. 8 is a cross-sectional view taken along the section line B-B shown in FIG. 6.

The piezoelectric-driven MEMS device according to the embodiment is configured such that the piezoelectric drive mechanism 12 comprising the lower electrodes 7 and upper electrode 9 in the piezoelectric-driven MEMS device according to the first embodiment is replaced with a piezoelectric drive mechanism comprising a first drive portion 22 and a second drive portion 26 as shown in FIGS. 7 and 8. The first drive portion 22 is disposed contiguous to a support film 10 and comprises first upper and lower electrodes 25, 23 by which a piezoelectric film 8 is sandwiched. The second drive portion 26 is disposed adjacent to the first drive portion 22 and comprises second upper and lower electrodes 29, 27 by which the piezoelectric film 8 is sandwiched. Two sets of the first and second drive portions 22, 26 are symmetrically disposed along the drive axis of the fixed beam.

In the piezoelectric film 4, a first via hole 31 and second via hole 32 are formed side by side between the first and second drive portions 22, 26 in the direction perpendicular to the drive axis. The first lower electrode 23 and the second upper electrode 29 are electrically connected through the first via hole 31, and the second lower electrode 27 and the first upper electrode 25 are electrically connected through the second via hole 32.

The first and second upper and lower electrodes 25, 23, 29 and 27 of the piezoelectric drive mechanisms may be made of Al and their thicknesses may be selected, for example, from on the order of 10 nm to 1 μm in consideration of resistance and the like. In this embodiment, all the thicknesses were 50 nm. The piezoelectric film 8 may be made of c-axis oriented AlN and its thickness may be selected, for example, from 10 nm to 1 μm in consideration of the amount of displacement. In this embodiment, the thickness was 500 nm. The support film 10 was made of $SiO_2$ film and its thickness was 1 μm. The equivalent area of the variable capacitor was 6400 μm². Further, according to this embodiment, the connection through the via holes allows the external shape of the piezoelectric film and the electrodes can be patterned simultaneously with the patterning of the connections, eliminating extra processes for connection. Furthermore, in each of the drive regions, in which the upper and lower electrodes face each other across the piezoelectric film therebetween, can be fabricated right-and-left and up-and-down symmetrically with respect to, for example, a rectangularly shaped drive axis such that no torsion occurs. The piezoelectric-driven MEMS device according to the embodiment has a stable structure, good controllability, and long travel range.

The piezoelectric-driven MEMS device of the embodiment ideally operates in a wide operating range. That is, when a driving voltage is applied, the first drive portion 22 and the second drive portion 26 deform in opposite directions. For example, when the first drive portion 22 deforms upward-convexly, the second drive portion 26 deforms downward-convexly. If the lengths of the drive portions are equal, gradients in the plane direction cancel each other, causing no extra load to be applied on the piezoelectric-driven MEMS device.

It is also possible to displace the movable electrode 6 of the variable capacitor at the center of the device upward or downward always parallel to itself, such that the capacitance between the movable electrode 6 and the fixed electrodes 3 can be continuously changed in the widest possible range, from the state in which these electrodes are separated to the state in which the entire surface of the electrodes are in contact each other.

A control voltage (Vtune) of 0 V to 3 V was applied to the variable capacitor in order to measure the capacitance between the movable electrode 6 and fixed electrode 3 of the variable capacitor. As a result, continuously variable capacitance was obtained ranging from a minimum of 0.34 pF to a maximum of 5.1 pF, which was a very wide variable range with a ratio of 15.

The piezoelectric-driven MEMS device according to the embodiment may also be reliable and consistently manufacturable, as in the first embodiment.

Exemplary Variations

Exemplary variations of the piezoelectric-driven MEMS device of the first and second embodiments will be described with reference to FIGS. 9 to 11. These variations are such that the way to connect the extension electrodes 4 to the pads is changed.

Figure 9:
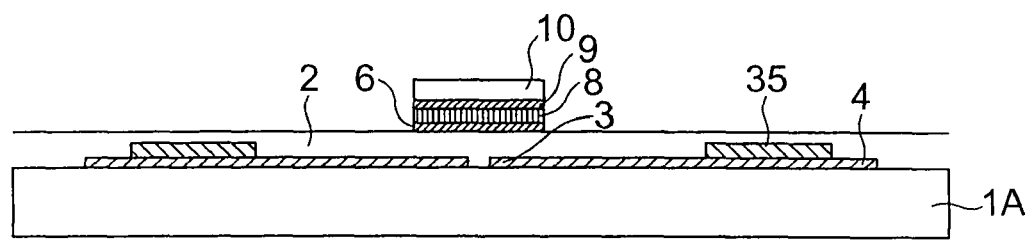
FIG. 9 is a cross-sectional view illustrating a first variation of the first or second embodiment.

As shown in FIG. 9, part of the recessed portion 2 formed on the substrate 1, i.e., the dug portion perpendicular to the longitudinal direction of the movable beam, may be extended to the ends of the substrate 1, and the extension electrodes 4 may also be extended, then pads 35 may be formed on the further extended extension electrodes 4.

Figure 10:
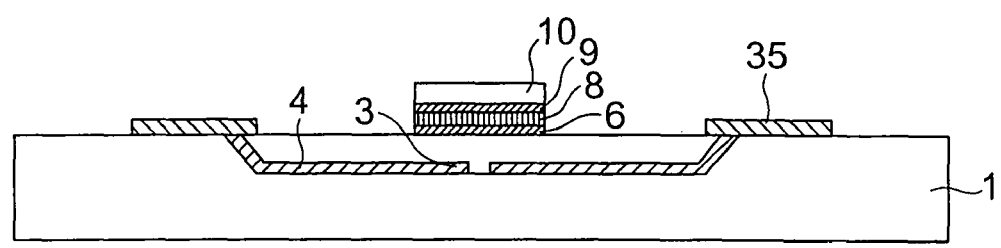
FIG. 10 is a cross-sectional view illustrating a second variation of the first or second embodiment.

Alternatively, as shown in FIG. 10, pads 35 may be formed on the substrate 1 such that they are electrically connected to the extension electrodes 4 formed on the tapered portions of the recessed portion 2.

Figure 11:
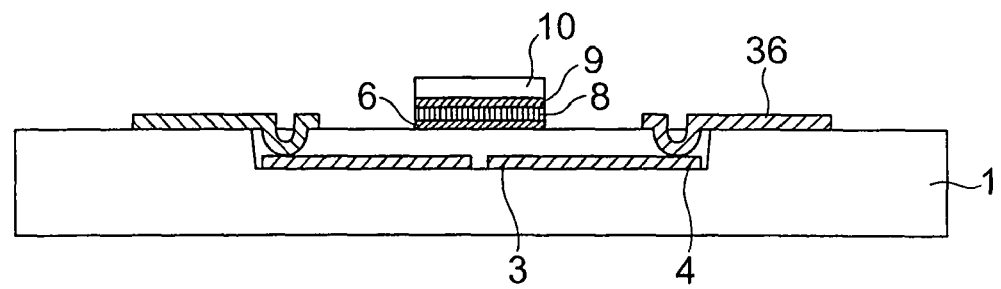
FIG. 11 is a cross-sectional view illustrating a third variation of the first or second embodiment.

Alternatively, as shown in FIG. 11, the configuration may be such that via holes are provided in the sacrificial layer 5 shown in FIG. 4D to be electrically connected to the extension electrodes 4 formed on the bottom of the recessed portion 2 of the substrate 1, and the extension electrodes 4 are electrically connected to pad 36 disposed on the substrate 1 through the via holes.

In each of the exemplary variations, the pads need to be formed prior to selectively etching off the sacrificial layer.

Third Embodiment

Figure 17:
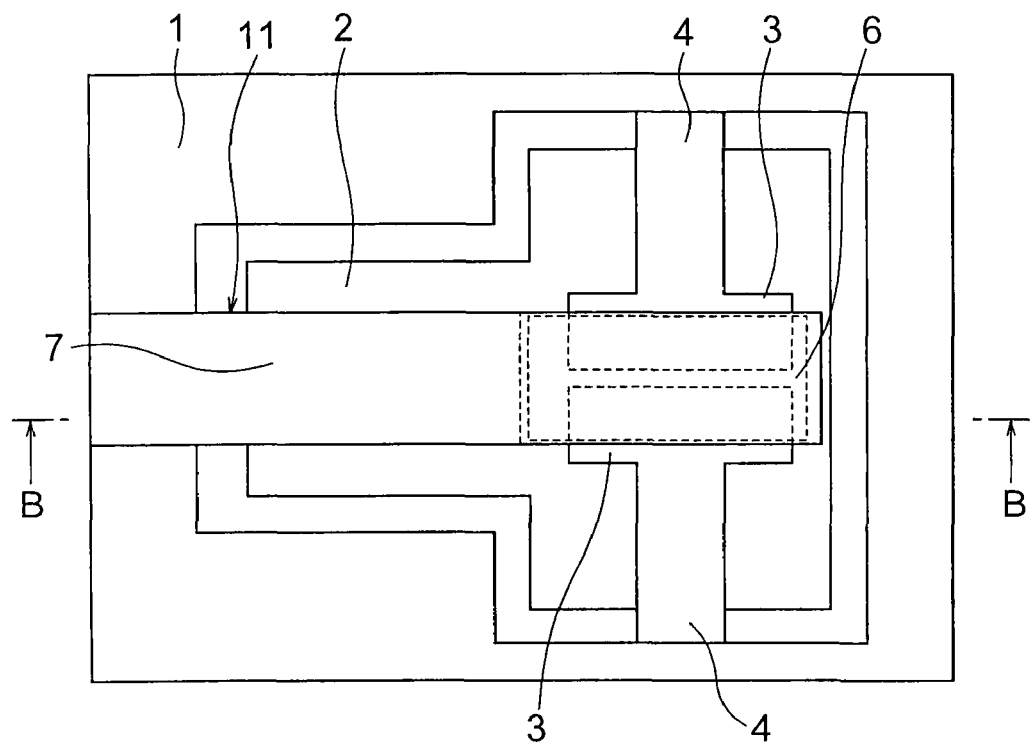
FIG. 17 is a plan view illustrating the configuration of a piezoelectric-driven MEMS device according to a third embodiment of the present invention.
Figure 18:
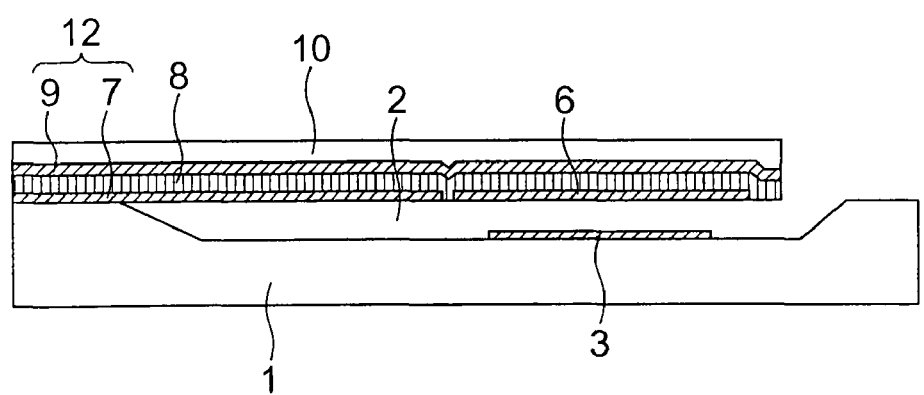
FIG. 18 is a cross-sectional view of the piezoelectric-driven MEMS device according to the third embodiment taken along the section line B-B shown in FIG. 17.

A piezoelectric-driven MEMS device according to a third embodiment of the present invention will be described with reference to FIGS. 17 to 18. FIG. 17 is a plan view of the piezoelectric-driven MEMS device according to the embodiment. FIG. 18 is a cross-sectional view taken along the section line B-B shown in FIG. 17.

The piezoelectric-driven MEMS device according to the embodiment is configured such that the movable beam 11 having the fixed beam structure in the piezoelectric-driven MEMS device according to the first embodiment is replaced with a movable beam 11 having a cantilever beam structure. The movable beam 11 having a cantilever beam structure comprises two ends, one is supported on the substrate 1 and the other is free. The movable beam 11 comprises a flat piezoelectric film 8 having a narrower width than that of the recessed portion 2 of the substrate, an upper electrode 9 disposed on the piezoelectric film 8, a support film 10 disposed on the upper electrode 9 and supporting the piezoelectric film 8, a lower electrodes 7 disposed on one end of the piezoelectric film 8 on the same side of the substrate 1, and a movable electrode 6 disposed at the other end of the piezoelectric film 8 on the same side of the substrate 1 and facing the fixed electrodes 3. The lower electrodes 7 and the upper electrode 9 form piezoelectric drive mechanisms 12.

In such a configuration of MEMS device, application of a voltage between the lower electrodes 7 and the upper electrode 9 results in deflection of the piezoelectric film 8, thereby changing the distance between the movable electrode 6 and the fixed electrodes 3 and hence changing the capacitance.

The third embodiment provides a reliable piezoelectric-driven MEMS device which can be consistently fabricated like the first embodiment.

In addition, the third embodiment has a smaller device area than that of the first embodiment, since the third embodiment has a cantilever beam structure.

Although in any one of the above first to third embodiments as well as each of the exemplary variations, the piezoelectric-driven MEMS device was described as a variable capacitor, by way of example, it is applicable to a microswitch.

Figure 12:
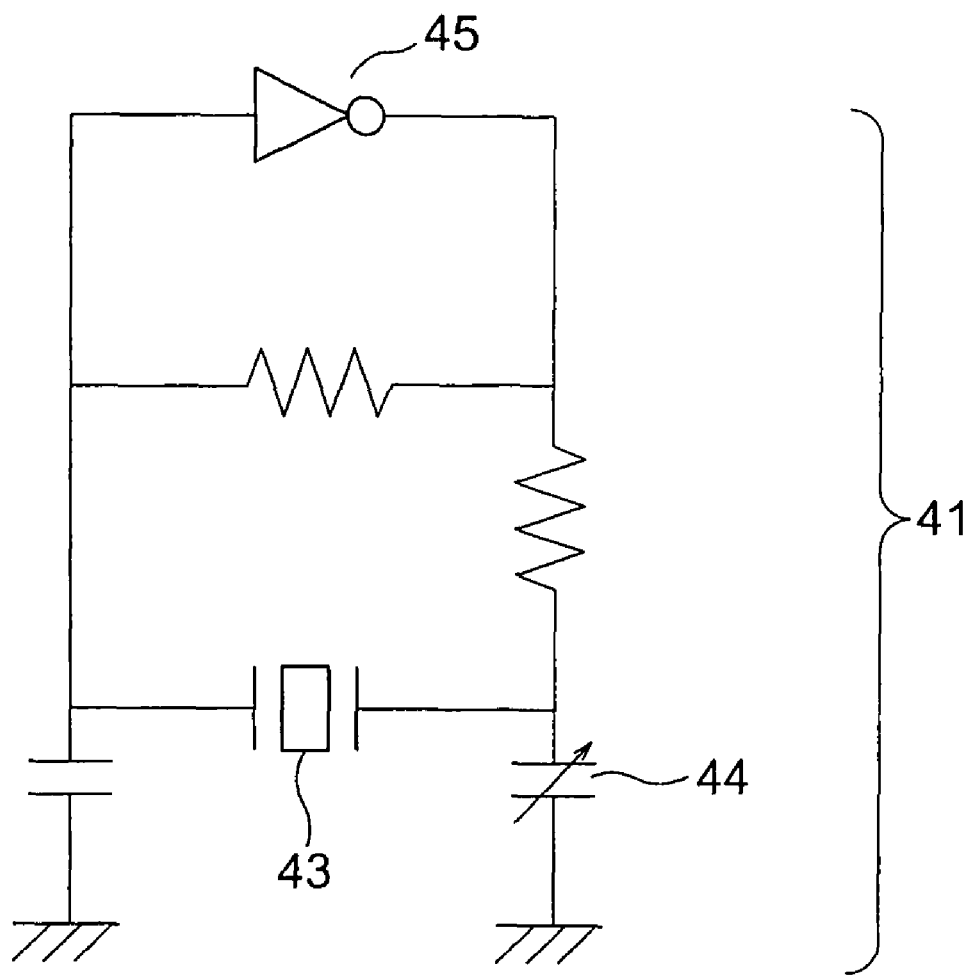
FIG. 12 is a circuit diagram illustrating the configuration of a voltage controlled oscillator which is an exemplary application of a variable capacitor according to each embodiment.

The variable capacitor described in any one of the first to third embodiments may be used as a voltage controlled oscillator (VCO) 41 for a mobile communication apparatus by combining the variable capacitor 44 with a thin-film piezoelectric resonator 43 and an amplifier 45 as shown in FIG. 12.

Figure 16:
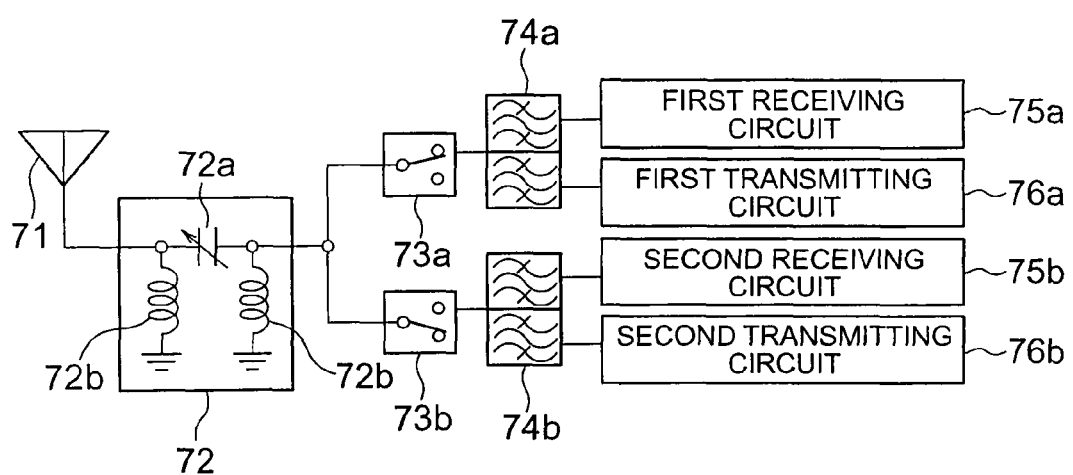
FIG. 16 is a circuit diagram illustrating the configuration of a dual band mobile communication apparatus which is an exemplary application of the piezoelectric-driven MEMS device of the first or second embodiment.

The variable capacitor described in any one of the first to third embodiments may be used as a tunable matching circuit 72 for a mobile communication apparatus by combining the variable capacitor 72a with inductor elements 72b as shown in FIG. 16. By using the tunable matching circuit 72, it is possible, for example, to achieve high gain for a plurality of carrier waves of different frequencies while using a single antenna. FIG. 16 is a circuit diagram illustrating the configuration of a dual band mobile communication apparatus that is an exemplary application of the piezoelectric-driven MEMS device any one of the first to third embodiments. This dual-band mobile communication apparatus comprises an antenna 71, a tunable matching circuit 72, switches for switching between the bands 73a, 73b, transmit-receive switches 74a, 74b, a first receiving circuit 75a, a first transmitting circuit 76a, a second receiving circuit 75b, and a second transmitting circuit 76b.

If the piezoelectric-driven MEMS device described in any one of the first to third embodiments is used as a microswitch, the device may be used, for example, as the switches for switching between the bands 73a, 73b for the mobile communication apparatus as shown in FIG. 16. By using a piezoelectric-driven MEMS switch, it is possible to achieve lower insertion loss when the switch is ON and higher insulation separation property when the switch is OFF than those of a high frequency switch using conventional semiconductor elements.

As described above, each of the embodiments of the present invention provides a reliable piezoelectric-driven MEMS device which can be consistently fabricated and a method for manufacturing the same.

In the first aspect of the present invention, the piezoelectric drive mechanism may comprise a first drive electrode disposed on the substrate side of the piezoelectric film and a second drive electrode disposed on the opposite side of the piezoelectric film from the substrate.

The piezoelectric drive mechanism may comprise: first and second drive electrodes disposed on the substrate side of the piezoelectric film; third and fourth drive electrodes disposed on the opposite side of the piezoelectric film from the substrate and facing the first and second drive electrodes; a first connection for electrically connecting the first and fourth drive electrodes through a first via hole disposed in the piezoelectric film; and a second connection for electrically connecting the second and third drive electrodes through a second via hole disposed in the piezoelectric film.

The movable beam may comprise a support film for supporting the piezoelectric film.

The recessed portion may have the shape of a cross.

The piezoelectric film may be formed of a material having a wurtzite crystal structure or a perovskite ferroelectric.

The drive electrodes primarily may comprise aluminum (Al), gold (Au), platinum (Pt), copper (Cu), iridium (Ir), tungsten (W), or molybdenum (Mo).

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concepts as defined by the appended claims and their equivalents.

What is claimed is:

1. A method for manufacturing a piezoelectric-driven MEMS device, the piezoelectric-driven MEMS device comprising: a movable flat beam having a piezoelectric film disposed above a substrate with a recessed portion such that the piezoelectric film is bridged over the recessed portion, piezoelectric drive mechanisms disposed on both ends of the piezoelectric film and configured to drive the piezoelectric film, and a first electrode disposed at the center of the substrate-side of the piezoelectric film, the recessed portion having the shape of a cross; and a second electrode disposed on a flat part of the recessed portion of the substrate and facing the first electrode of the movable flat beam, the method comprising:

forming the recessed portion with a flat bottom on the substrate;

forming the second electrode on the bottom of the recessed portion;

filling the recessed portion with a sacrificial layer;

removing the sacrificial layer on the surface of the substrate and flattening the surface of the substrate;

forming the movable flat beam above the substrate such that the movable flat beam is bridged over the recessed portion; and etching off the sacrificial layer.

2. The method for manufacturing a piezoelectric-driven MEMS device according to claim 1, wherein the substrate has an insulating film thereon and the recessed portion is formed by removing part of the insulating film.

* * * * *